US009529945B2

(12) United States Patent
Atohira et al.

(10) Patent No.: US 9,529,945 B2
(45) Date of Patent: Dec. 27, 2016

(54) ROBOT SIMULATION SYSTEM WHICH SIMULATES TAKEOUT PROCESS OF WORKPIECES

(71) Applicant: FANUC Corporation, Yamanashi (JP)

(72) Inventors: Hiroyuki Atohira, Yamanashi (JP); Yoshiharu Nagatsuka, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 20 days.

(21) Appl. No.: 14/642,961

(22) Filed: Mar. 10, 2015

(65) Prior Publication Data

US 2015/0261899 A1 Sep. 17, 2015

(30) Foreign Application Priority Data

Mar. 12, 2014 (JP) ................................ 2014-048790

(51) Int. Cl.
*G06F 17/50* (2006.01)
*B25J 9/16* (2006.01)

(52) U.S. Cl.
CPC .......... *G06F 17/5009* (2013.01); *B25J 9/1671* (2013.01); *B25J 9/1687* (2013.01); *G05B 2219/40006* (2013.01); *G05B 2219/40323* (2013.01); *G05B 2219/40515* (2013.01)

(58) Field of Classification Search
USPC ........................................................ 703/2, 7
See application file for complete search history.

(56) References Cited

U.S. PATENT DOCUMENTS

| 6,721,444 | B1 | 4/2004 | Gu et al. |
| 7,876,455 | B2 | 1/2011 | Kawasaki et al. |
| 8,326,469 | B2* | 12/2012 | Phillips ................ G05D 1/0088 701/2 |
| 9,044,858 | B2* | 6/2015 | Ito ............................ B25J 9/1612 |
| 9,153,030 | B2* | 10/2015 | Miyatani ............... G06T 7/0046 |

(Continued)

FOREIGN PATENT DOCUMENTS

| DE | 10080012 B4 | 4/2005 |
| JP | 2007-241857 A | 9/2007 |

(Continued)

*Primary Examiner* — Thai Phan
(74) *Attorney, Agent, or Firm* — Hauptman Ham, LLP

(57) ABSTRACT

A robot simulation system includes a first plane calculation part which calculates a group of first planes extending through focal points of two camera models and divide the fields of vision of the two camera models at equal intervals when capturing a measurement region, a second plane calculation part which calculates a group of second planes which intersect the first planes and extend along boundaries of light-dark contrast formed on the measurement region with stripe shaped patterns of light from the projector model, an intersecting line calculation part which calculates a plurality of intersecting lines between the first planes and the second planes, a three-dimensional information calculation part which calculates positions of intersecting points between the intersecting lines and surfaces of the workpiece models as three-dimensional information, and a position and posture calculation part which calculates positions and postures of the workpiece model based on the three-dimensional information.

2 Claims, 15 Drawing Sheets

(56) References Cited

U.S. PATENT DOCUMENTS

| | | | |
|---|---|---|---|
| 2008/0027590 A1* | 1/2008 | Phillips | G05D 1/0088 |
| | | | 701/2 |
| 2010/0232684 A1 | 9/2010 | Fujieda et al. | |
| 2011/0122228 A1 | 5/2011 | Fujieda et al. | |
| 2013/0054025 A1* | 2/2013 | Ito | B25J 9/1697 |
| | | | 700/246 |
| 2013/0204465 A1* | 8/2013 | Phillips | G05D 1/0278 |
| | | | 701/2 |

FOREIGN PATENT DOCUMENTS

| | | |
|---|---|---|
| JP | 2007-245283 A | 9/2007 |
| JP | 2007-326160 A | 12/2007 |
| JP | 2009-128191 A | 6/2009 |
| JP | 2011-83882 A | 4/2011 |
| JP | 2013-101045 A | 5/2013 |
| JP | 2013-186088 A | 9/2013 |
| JP | 2014-013146 A | 1/2014 |
| WO | 2006/013635 A1 | 2/2006 |

* cited by examiner

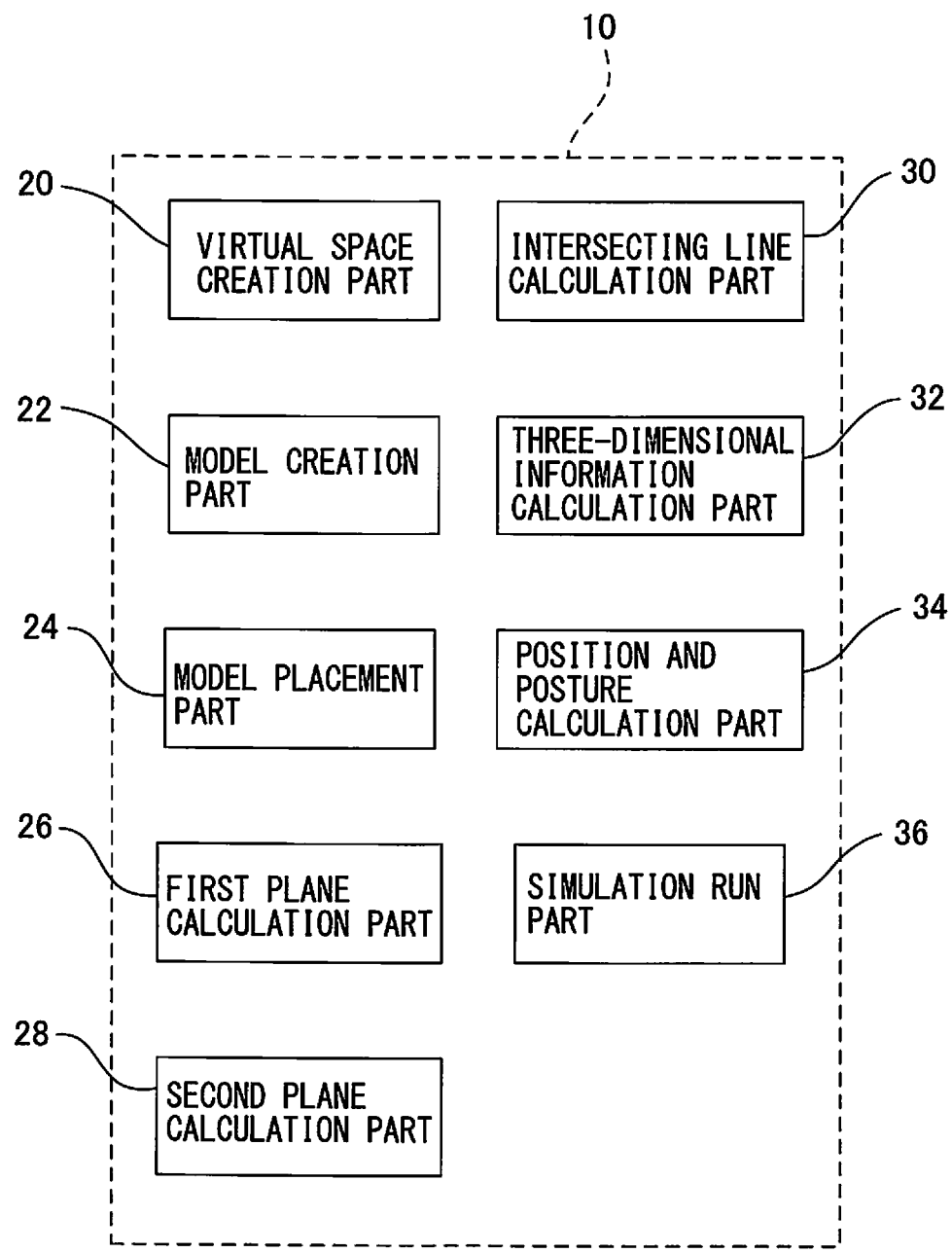

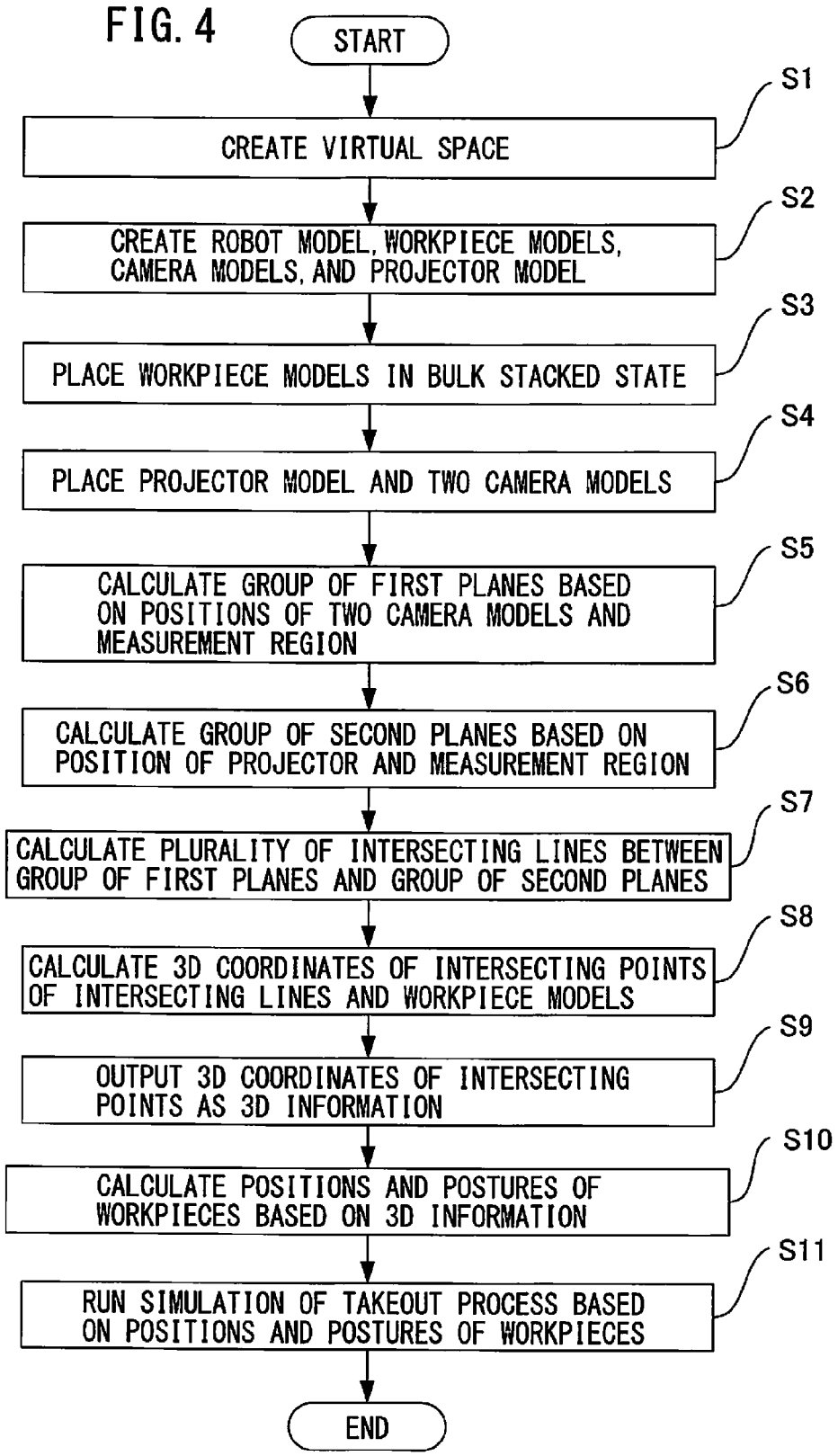

ROBOT SIMULATION SYSTEM WHICH SIMULATES TAKEOUT PROCESS OF WORKPIECES

RELATED APPLICATIONS

The present application claims priority to Japanese Application Number 2014-048790, filed Mar. 12, 2014, the disclosure of which is hereby incorporated by reference herein in its entirety.

BACKGROUND OF THE INVENTION

1. Field of the Invention

The present invention relates to a robot simulation system which simulates a takeout process by a robot for successively taking out bulk stacked workpieces.

2. Description of the Related Art

A robot simulation system is used for simulating a robot handling a workpiece or performing other predetermined operations in a virtual space. The results of simulation are utilized for evaluating the control program of the robot and for changing the program or the positional relationship of objects in the work space as necessary.

A known robot simulation system which simulates a takeout process for successively holding and conveying bulk stacked workpieces to a predetermined position by a robot. In the related art, the takeout process is simulated by, for example, arranging a three-dimensional model of a camera, which detects the positions and postures of the workpieces, in a virtual space.

JP2007-241857A discloses a robot simulation system which simulates off-line the operation of a robot which has a visual sensor. This robot simulation system is configured to identify a target workpiece model to be taken out and measure the position and posture of the target workpiece model, based on a two-dimensional virtual image which is obtained by a sensor model which captures an image of workpiece models in a virtual space.

JP2007-326160A discloses a robot simulation system which is configured to obtain a virtual image of a workpiece by a camera model which is arranged in a virtual space. In this robot simulation system, a teaching point for the robot model is corrected based on the obtained virtual image.

JP2013-101045A discloses a recognition system which is configured to recognize the position and posture of an object based on a two-dimensional image obtained by a camera and three-dimensional information which is obtained by a range sensor. This related art is intended to shorten the time which is required for processing the two-dimensional image by setting search conditions for detecting the two-dimensional position of the object based on the three-dimensional information.

JP2007-245283A discloses a workpiece posture detecting system which is provided with a camera for acquiring image data of a workpiece. This workpiece posture detecting system is configured to detect the posture of a workpiece based on a stable posture which best matches the posture of the workpiece in the image data which is obtained by the camera, among a plurality of stable postures of the workpiece which are stored in advance. This related art is intended to shorten the calculation time which is required for matching.

JP2009-128191A discloses an object recognition system which is configured to recognize the position and posture of an object by comparing three-dimensional surface shape data of the object to be recognized with three-dimensional surface shape data acquired by sampling actual state of the object which is obtained by a distance sensor, or the like.

JP2014-013146A discloses a three-dimensional measurement system which is provided with two cameras for capturing images of a workpiece at different viewing points and is configured to measure the three-dimensional position of the workpiece. This three-dimensional measurement system is designed to measure the three-dimensional position of the workpiece, based on a first image which is obtained by a first camera and a second image of a second camera which is cut out in accordance with a cutout range of the second camera which is calculated based on the first image.

In a takeout process of workpieces, a range sensor may be used to obtain three-dimensional information of workpieces. Therefore, there is a need for a robot simulation system which acquires three-dimensional information of bulk stacked workpieces in a virtual space by a range sensor, and thereby enables simulation of the takeout process.

SUMMARY OF THE INVENTION

According to a first aspect of the present application, there is provided a robot simulation system for simulating in a virtual space a takeout process for successively taking out a plurality of bulk stacked workpieces by a robot, based on three-dimensional information of the workpieces which is obtained by a range sensor including two cameras and a projector, the robot simulation system comprising a model placement part which places in the virtual space a robot model, a plurality of workpiece models, two camera models, and a projector model which three-dimensionally express the robot, the plurality of workpieces, and the two cameras and the projector of the range sensor, respectively, wherein the model placement part is configured to place the plurality of workpiece models in the virtual space in a bulk stacked state, and place the two camera models and the projector model in the virtual space so that fields of vision of the two camera models and a projection range of the projector model encompass a measurement region which is set for bulk stacked workpiece models, the robot simulation system further comprising: a first plane calculation part which calculates a group of first planes which extend through focal points of the two camera models and divide the fields of vision of the two camera models at equal intervals when capturing the measurement region; a second plane calculation part which calculates a group of second planes which intersect the group of first planes and extend along boundaries of light-dark contrast which are formed on the measurement region when the projector model projects stripe shaped patterns of light on the measurement region; an intersecting line calculation part which calculates a plurality of intersecting lines between the group of first planes and the group of second planes; a three-dimensional information calculation part which calculates positions of a plurality of intersecting points between the plurality of intersecting lines and surfaces of the workpiece models as three-dimensional information, a position and posture calculation part which calculates positions and postures of the workpiece models based on the three-dimensional information, and a simulation run part which runs a simulation of the takeout process by the robot model based on the positions and postures of the workpiece models which are calculated by the position and posture calculation part.

According to a second aspect of the present application, there is provided the robot simulation system according to the first aspect, wherein the model placement part is configured to place a second camera which captures an image of the bulk stacked workpiece models in the virtual space, the robot simulation system further comprises a two-dimensional image acquisition part which acquires a two-dimensional image of the bulk stacked workpiece models from the second camera, and the position and posture calculation part is further configured to calculate positions and postures of the workpiece models, based on the three-dimensional information and the two-dimensional image.

These and other objects, features, and advantages of the present invention will become clearer with reference to the detailed description of illustrative embodiments of the present invention which are shown in the accompanying drawings.

BRIEF DESCRIPTION OF THE DRAWINGS

FIG. 3 is a functional block diagram of a robot simulation system according to one embodiment.

FIG. 4 is a flow chart which shows a flow of processes for simulation of a takeout process which is performed by a robot simulation system according to one embodiment.

DETAILED DESCRIPTION OF THE INVENTION

Figure 1:
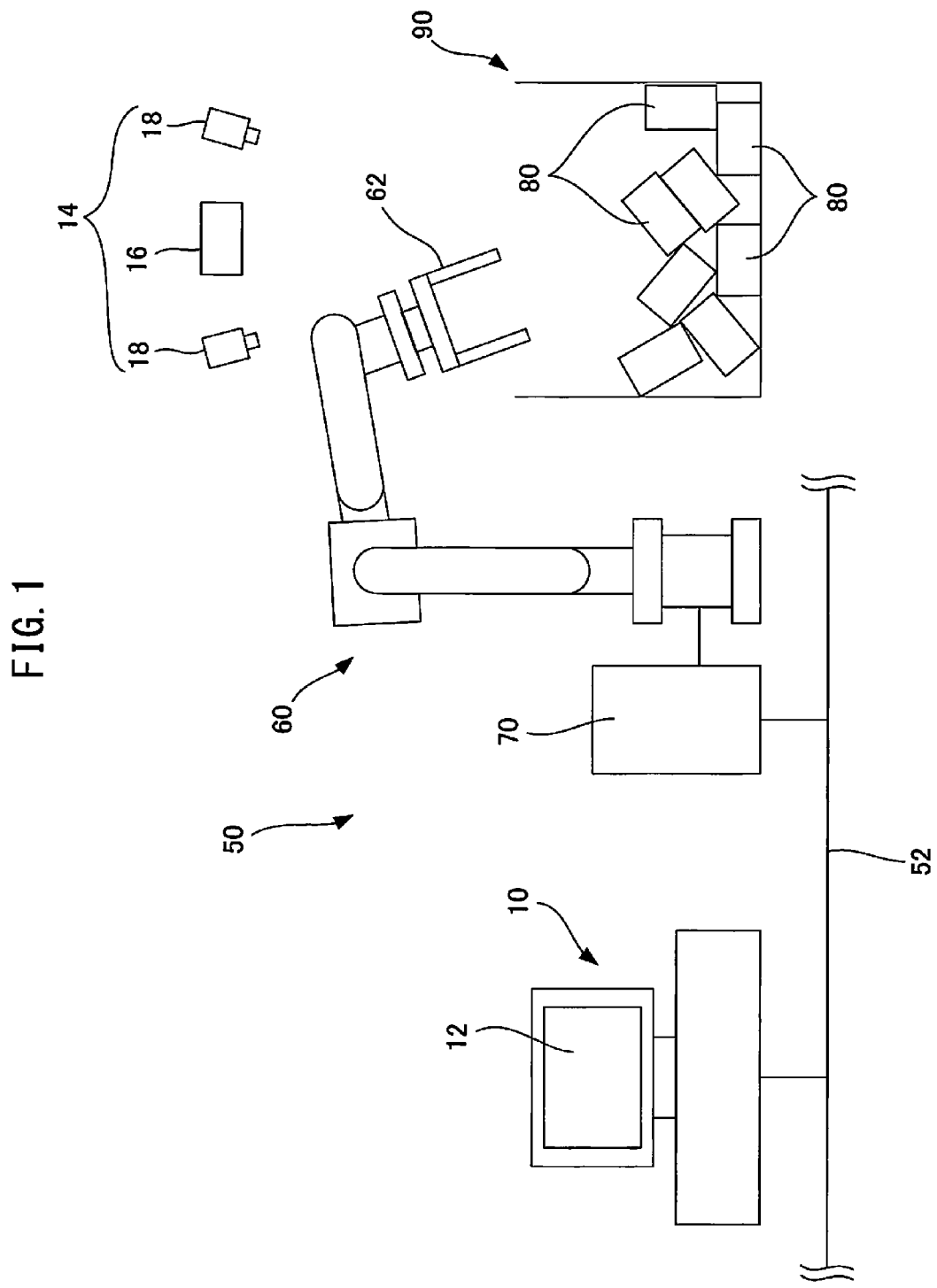
FIG. 1 is an overall view of a robot system which includes a robot simulation system according to one embodiment.

Below, the present invention will be described while referring to the accompanying drawings. The constituent elements of the illustrated embodiments are suitably changed in scale to facilitate understanding of the present invention. Further, the same or corresponding constituent elements are assigned the same reference numerals throughout the drawings.

FIG. 1 is an overall view of a robot system 50 which includes a robot simulation system 10 according to one embodiment. The robot simulation system 10 is, for example, a digital computer for off-line operation, which is configured to create a robot program and run it in a virtual space.

The robot simulation system 10, although not shown, includes a CPU for performing various calculations, a RAM which stores the results of calculations by the CPU, a ROM which stores various programs, data, etc., and an input device. The input device is a mouse, keyboard, touch panel, or other known input means. The robot simulation system 10 further includes a display part 12 such as a liquid crystal display.

The robot system 50 includes a robot 60. The robot 60 is a multiple joints robot which is controlled by a robot control device 70. The robot simulation system 10 and the robot control device 70 are connected with each other through a communicating part 52 which has a known configuration for transfer of data or signals. The communicating part 52 is, for example, used for transmitting a control program which controls the robot 60 from the robot control device 70 to the robot simulation system 10.

The robot 60 includes a hand 62 which can, for example, grip a workpiece 80, at a wrist part at a tip end of an arm. The robot 60 is controlled by the robot control device 70 so as to successively take out workpieces 80 from a large number of workpieces 80 which are bulk stacked, that is, irregularly arranged, in a container 90. The robot 60 is not limited to the illustrated example and may have any known configuration. For example, the robot 60 may be a robot of a type which includes a hydraulic or magnetic type of suction part at the wrist part.

The container 90 has the form of a basket, for example, which has a bottom and a peripheral wall which extends upward from the bottom substantially in a vertical direction. The container 90 is open at the top so that the robot 60 can access an accommodation space in the container 90.

In the illustrated example, the workpieces 80 have box shapes, but the workpieces 80 are not limited in shapes to this. Further, the container 90 may have any shape so long as the robot 60 can access the workpieces 80.

Above the container 90, a range sensor 14 is fastened to a stand, which is not shown. The range sensor 14 is configured to be able to obtain a distance from an object. In this robot system 50, it has the function of acquiring three-dimensional information of the workpieces 80. For example, the range sensor 14 acquires three-dimensional information of the workpieces 80 in the form of a distance image or three-dimensional map, or the like. A "distance image" is an image which expresses the distance from the range sensor 14 to the workpieces 80 within a measurement region by a light-dark contrast or colors of the pixels. Further, a "three-dimensional map" expresses the three-dimensional positions of workpieces 80 within a measurement region with a group of three-dimensional coordinate values of points on the surfaces of the workpieces 80.

The range sensor 14 includes a projector 16 and two cameras 18 which are arranged at opposite sides of the projector 16. The projector 16 is configured to be able to project spots of light, slits of light, or other patterns of light on the surfaces of objects. The projector 16 includes a known light source such as a laser diode or light emitting diode.

The cameras 18 are known digital cameras which include an imaging device such as CCD or CMOS. The two cameras 18 are oriented in different directions from each other so that their fields of vision at least partially overlap. The projector 16 is arranged so that its projection range at least partially overlaps the fields of vision of the cameras 18. The range sensor 14 may be fastened to the wrist part of the robot 60 so that its position and posture can be changed as necessary.

The range sensor 14 is controlled by a sensor control device, which is not shown, and configured to be able to detect three-dimensional information of the workpieces 80. The three-dimensional information of a workpiece 80 includes position information of a specific portion of the workpiece 80, for example, the position of a vertex, or a position and posture of a certain plane of the workpiece 80, etc. The three-dimensional information of the workpieces 80 which is detected by the range sensor 14 is output through the sensor control device to the robot control device 70. Alternatively, the information detected by the range sensor 14 may be directly transmitted to the robot control device 70. The sensor control device may also include an image processing device which processes the two-dimensional images which are obtained by the cameras 18 of the range sensor 14. The image processing device may also be provided separately from the sensor control device.

The robot control device 70 controls the position and posture of the robot 60 based on the three-dimensional information of the workpieces 80 which is acquired by the range sensor 14, in order to perform the operation of gripping workpieces 80 by the hand 62.

Figure 2:
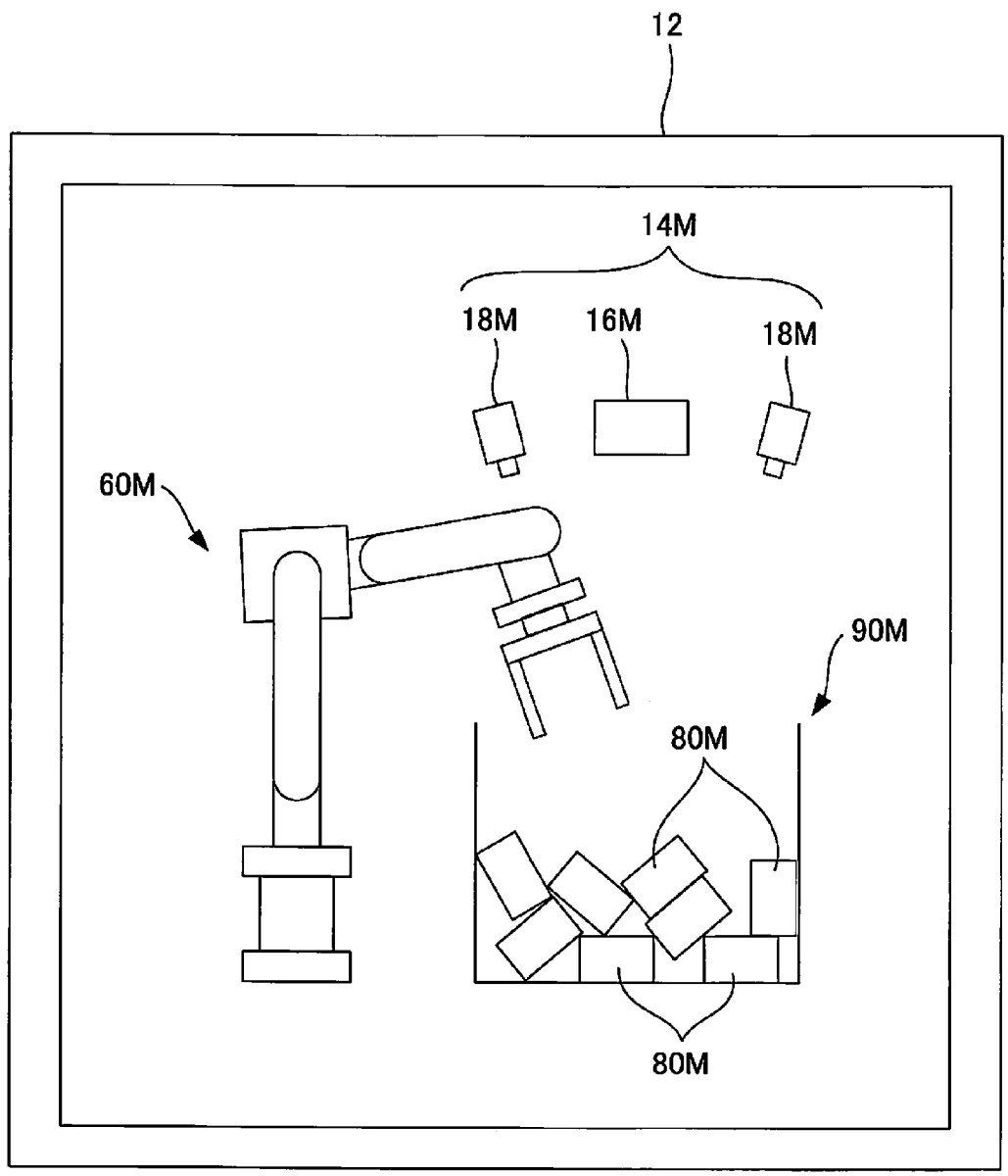
FIG. 2 is an exemplary display by a display part of the robot simulation system.

FIG. 2 is an exemplary display by the display part 12 of the robot simulation system 10. The display part 12 displays a virtual space which expresses a work space of the robot 60 three-dimensionally, as shown in FIG. 1. As illustrated, the screen of the display part 12 displays a robot model 60M, range sensor model 14M, workpiece models 80M, and container model 90M which express a robot 60, range sensor 14, workpieces 80, and container 90 three dimensionally. Although two-dimensional information is shown in the display part 12 in FIG. 2, the operator can change the view point using an input device in order to check the positional relationship of the respective elements in a three-dimensional space.

The robot simulation system 10 is configured to be able to perform in a virtual space a takeout process for successively taking out workpiece models 80M which are bulk stacked inside the container model 90M by the robot model 60M. The operator can check whether the control program for the robot 60M is suitable based on the results of simulation which is run in the virtual space, and correct the program as necessary.

FIG. 3 is a functional block diagram of the robot simulation system 10. The robot simulation system 10 includes a virtual space creation part 20, a model creation part 22, a model placement part 24, a first plane calculation part 26, a second plane calculation part 28, an intersecting line calculation part 30, a three-dimensional information calculation part 32, a position and posture calculation part 34, and a simulation run part 36.

The virtual space creation part 20 has the function of creating a virtual space which three-dimensionally expresses the work space of the robot 60. The virtual space which is created by the virtual space creation part 20 is displayed on the display part 12 of the robot simulation system 10.

The model creation part 22 has the function of creating a robot model 60M, range sensor model 14M, workpiece models 80M, and container model 90M. The range sensor model 14M is comprised of a projector model 16M and two camera models 18M (see FIG. 2). The model creation part 22 is configured to create the respective models by reading out shape data which is created by three-dimensional CAD software or the like, from the ROM of the robot simulation system 10 or an external storage device.

The model placement part 24 has the function of placing the respective three-dimensional models which are created by the model creation part 22 in the virtual space. According to the present embodiment, the model placement part 24 is configured to place a plurality of workpiece models 80M in a bulk stacked state in the virtual space. Further, the model placement part 24 is configured to place the projector model 16M and two camera models 18M in the virtual space so that the projection range of the projector model 16M and fields of vision of the two camera models 18M encompass the measurement region which is set for the bulk stacked workpiece models 80M.

The first plane calculation part 26 has the function of calculating a group of first planes in the virtual space. The first planes are defined as planes which extend through the focal points of the two camera models 18M so as to divide the fields of vision of the camera models 18M when capturing a measurement region at equal intervals.

The second plane calculation part 28 has the function of calculating a group of second planes in the virtual space. The second planes are defined as planes which intersect the first planes and extend along boundaries of light-dark contrast formed by the projection onto the measurement region when the projector model 16M projects stripe shaped patterns of light in the measurement region.

The intersecting line calculation part 30 has the function of calculating a plurality of intersecting lines of the group of first planes and the group of second planes.

The three-dimensional information calculation part 32 has the function of calculating positions of a plurality of intersecting points between the plurality of intersecting lines which are calculated by the intersecting line calculation part 30 and the surfaces of the workpiece models 80M, for example, the distance image or three-dimensional map of the same, as three-dimensional information of the workpiece models 80M.

The position and posture calculation part 34 has the function of calculating the positions and postures of the workpiece models 80M, based on the three-dimensional information of the workpiece models 80M which is calculated by the three-dimensional information calculation part 32. For example, the position and posture calculation part 34 calculates the positions and postures of the workpiece models 80M by matching the three-dimensional information of the workpiece models 80M with shape models of the workpiece models 80M.

The simulation run part 36 has the function of running simulation of the takeout process by the robot model 60M, based on the positions and postures of the workpiece models 80M which are calculated by the position and posture calculation part 34. Since the takeout process can be simulated in any known manner, a detailed explanation is omitted in this specification.

FIG. 4 is a flow chart which illustrates steps of running a simulation of the takeout process. Note that, in the following explanation, for convenience, "first", "next", "then", and other expressions may be used, but these terms are not intended to limit the order of the steps. Rather, a person skilled in the art would recognize that the same or similar actions and effects can be realized even if the order of the steps explained below is changed as necessary, so long as no technical contradiction is caused by such changes.

First, at step S1, the virtual space creation part 20 creates a virtual space which corresponds to the work space of the robot 60. Next, at step S2, the model creation part 22 creates a robot model 60M, workpiece models 80M, range sensor model 14M, and container model 90M. In the present embodiment, it creates a projector model 16M and two camera models 18M which form the range sensor model 14M. Further, for example, when there is no need to consider interference between the robot and the container, creation of the container model 90M may be omitted.

At step S3, the model placement part 24 places the workpiece models 80M which are created at step S2 in a bulk stacked state in the virtual space (see FIG. 2). The workpiece models 80M in the bulk stacked state are created in accordance with any known method. For example, it is possible to create the bulk stacked state by determining the positions and posture of the workpiece models 80M using random numbers, and stacking the workpiece models 80M in order in the container model 90M so as not to overlap one another.

Figure 5A:
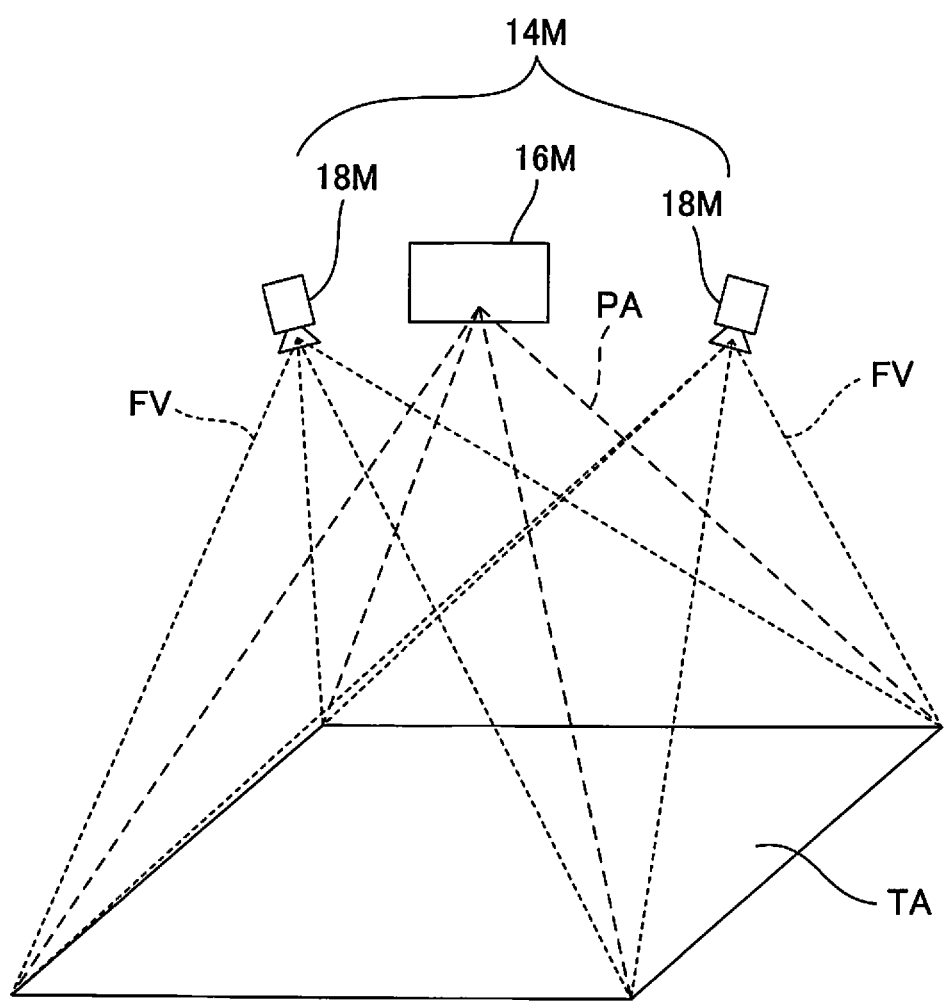
FIG. 5A is a view which shows a projection range of a projector model and fields of vision of camera models.
Figure 5B:
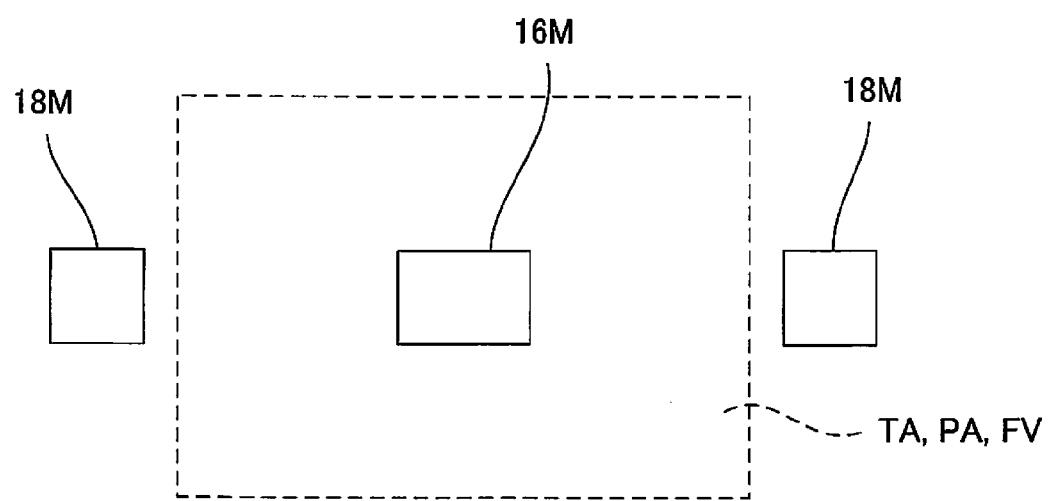
FIG. 5B is a top view which shows an exemplary positional relationship between a projector model and camera models.

At step S4, the model placement part 24, as shown in FIG. 2, places the projector model 16M and two camera models 18M in the virtual space. Referring further to FIG. 5A and FIG. 5B, the arrangement of the projector model 16M and camera models 18M will be explained. FIG. 5A is a view which shows the projection range of the projector model 16M and the fields of vision of the camera models 18M. FIG. 5B is a top view which shows an exemplary positional relationship between the projector model 16M and camera models 18M.

FIG. 5A shows the projector model 16M and two camera models 18M of the range sensor model 14M and the projection range PA of the projector model 16M and fields of vision FV of the camera models 18M. Further, FIG. 5A and FIG. 5B show the measurement region TA which is set in advance for the bulk stacked workpiece models 80M. The measurement region TA is determined in accordance with the target range which is measured by the range sensor model 14M. For example, the measurement region TA is set so that some or all of the bulk stacked workpiece models 80M are included therein. For example, the measurement region TA is defined as a bottom surface of the container model 90M or a horizontal plane which is at a predetermined distance from the bottom surface.

As shown in FIG. 5A, the projection range PA of the projector model 16M and fields of vision FV of the camera models 18M are designed to generally coincide with the measurement region TA, respectively. Further, as shown in FIG. 5B, the projector model 16M and two camera models 18M are arranged on the same line as each other. However, the positional relationship of the projector model 16M and camera models 18M is not limited to such a specific example. For example, as long as the projector model 16M and camera models 18M are arranged so that the projection range PA and fields of vision FV encompass the measurement region TA, respectively, the projection range PA and fields of vision FV may overlap each other only partially.

Figure 6:
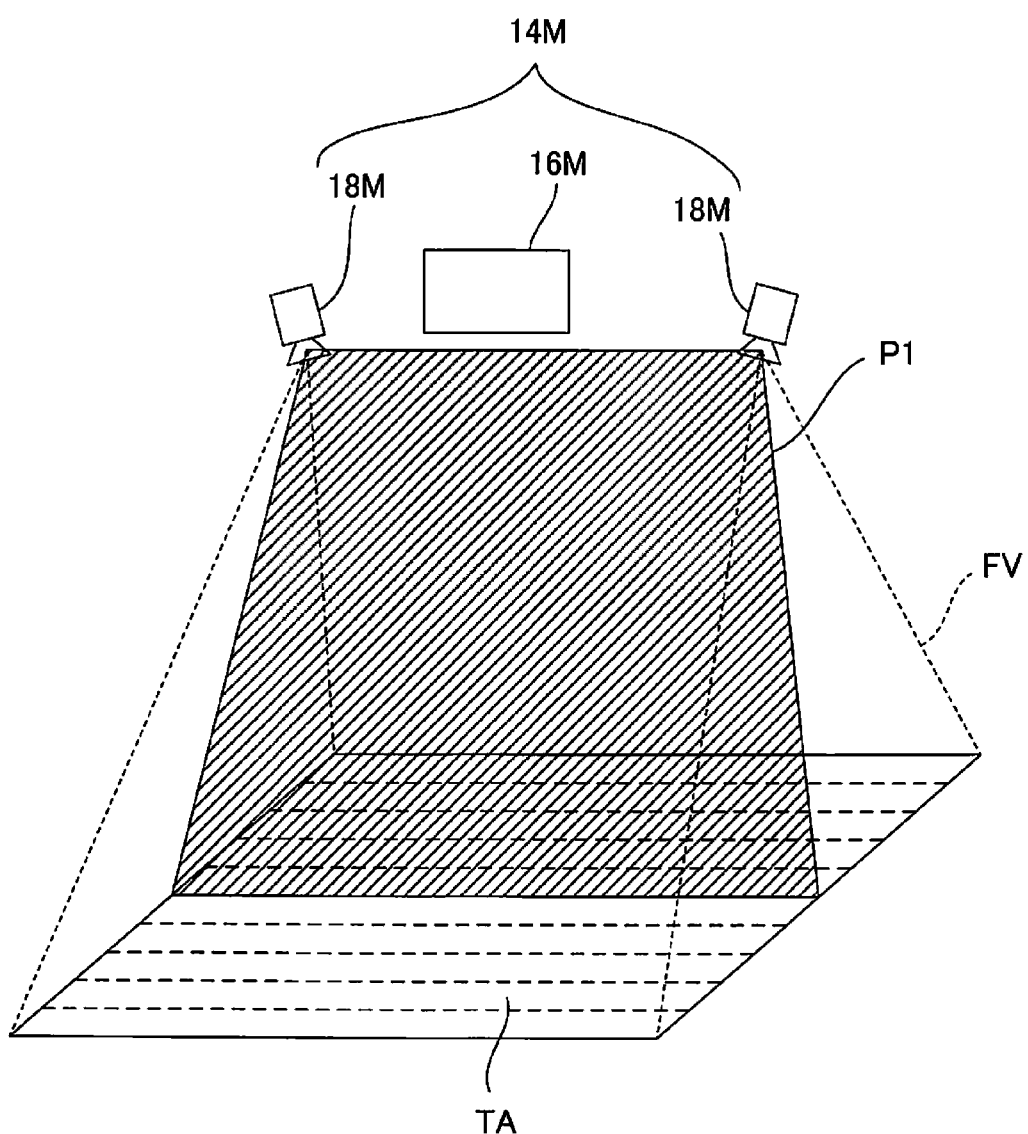
FIG. 6 is a view which shows first planes.

Returning to FIG. 4, at step S5, the first plane calculation part 26 then calculates the group of first planes. FIG. 6 shows the first planes P1. The first planes P1 are planes which extend through the focal points of the two camera models 18M and divide the fields of vision of the camera models 18M when capturing the measurement region TA at equal intervals. FIG. 6 shows one of the group of first planes P1. In FIG. 6, the broken lines which are drawn on the measurement region TA are virtual lines which divide the measurement region TA at equal intervals. Note that, the positions of the camera models 18M in the virtual space and in turn the positions of the focal points of the camera models 18M are predetermined set values. Alternatively, the results of camera calibration may be utilized to calculate the positions of the camera models 18M and their focal points.

Figure 7:
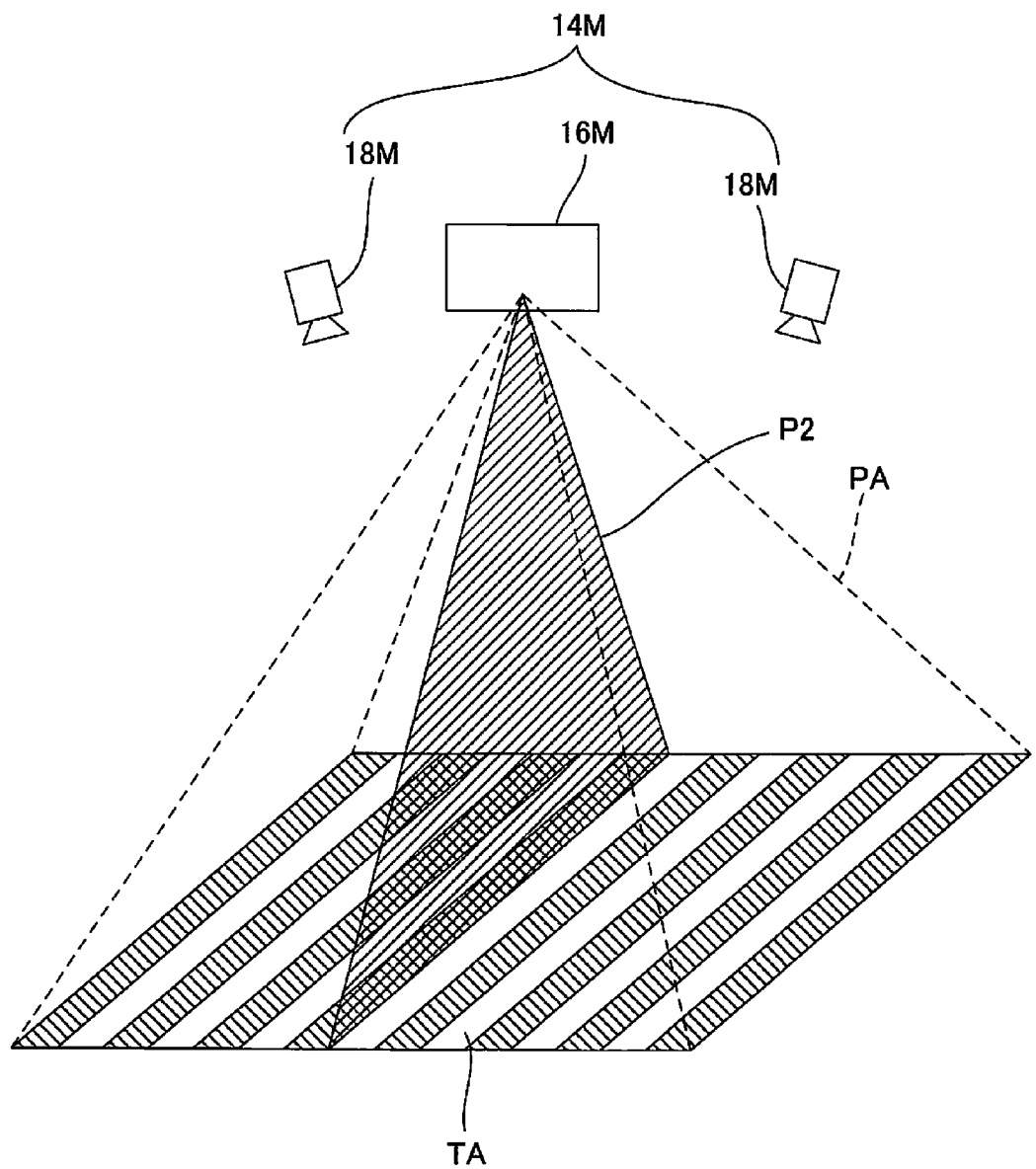
FIG. 7 is a view which shows second planes.

Next, at step S6, the second plane calculation part 28 calculates the group of second planes. FIG. 7 is a view which shows the second planes P2. The second planes P2 are planes which extend along the boundaries of light-dark contrast which are formed on the measurement region TA when the projector model 16M projects stripe shaped patterns of light on the measurement region TA. In FIG. 7, the patterns of light-dark contrast on the measurement region TA are expressed by hatching. Note that, the screen of the display part 12 of the robot simulation system 10 does not need to actually display the patterns of light-dark.

Figure 8A:
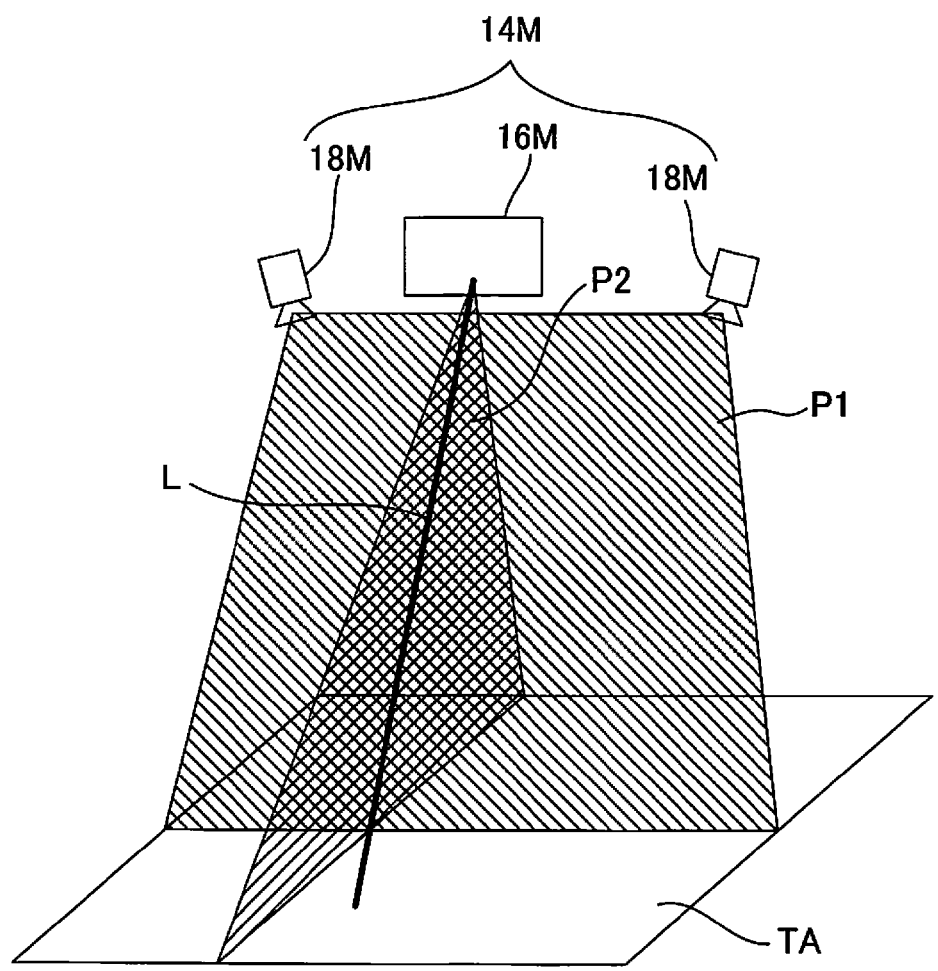
FIG. 8A is a view which shows an intersecting line of a first plane and a second plane.
Figure 8B:
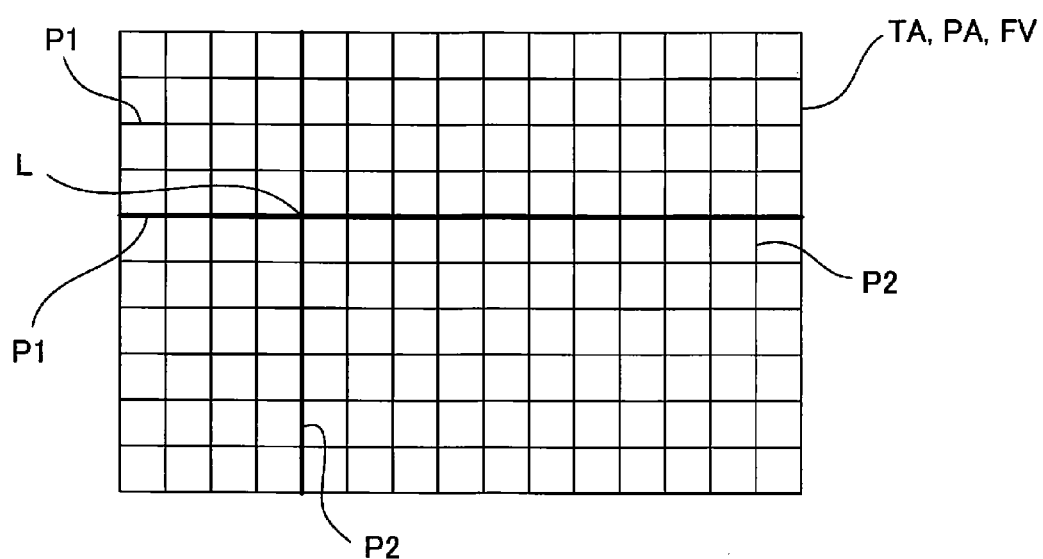
FIG. 8B is a top view which shows a group of the first planes and a group of the second planes.

At step S7, the intersecting line calculation part 30 calculates the intersecting lines L between the first planes P1 and the second planes P2 which are obtained at steps S5 and S6, respectively. FIG. 8A is a view which shows an intersecting line L, while FIG. 8B is a top view which shows the group of the first planes P1 and the group of the second planes P2. In FIG. 8B, the intersecting line L which extends through the intersecting point of the first plane P1 and the second plane P2 which are shown by the bold lines is shown as one example.

Figure 9:
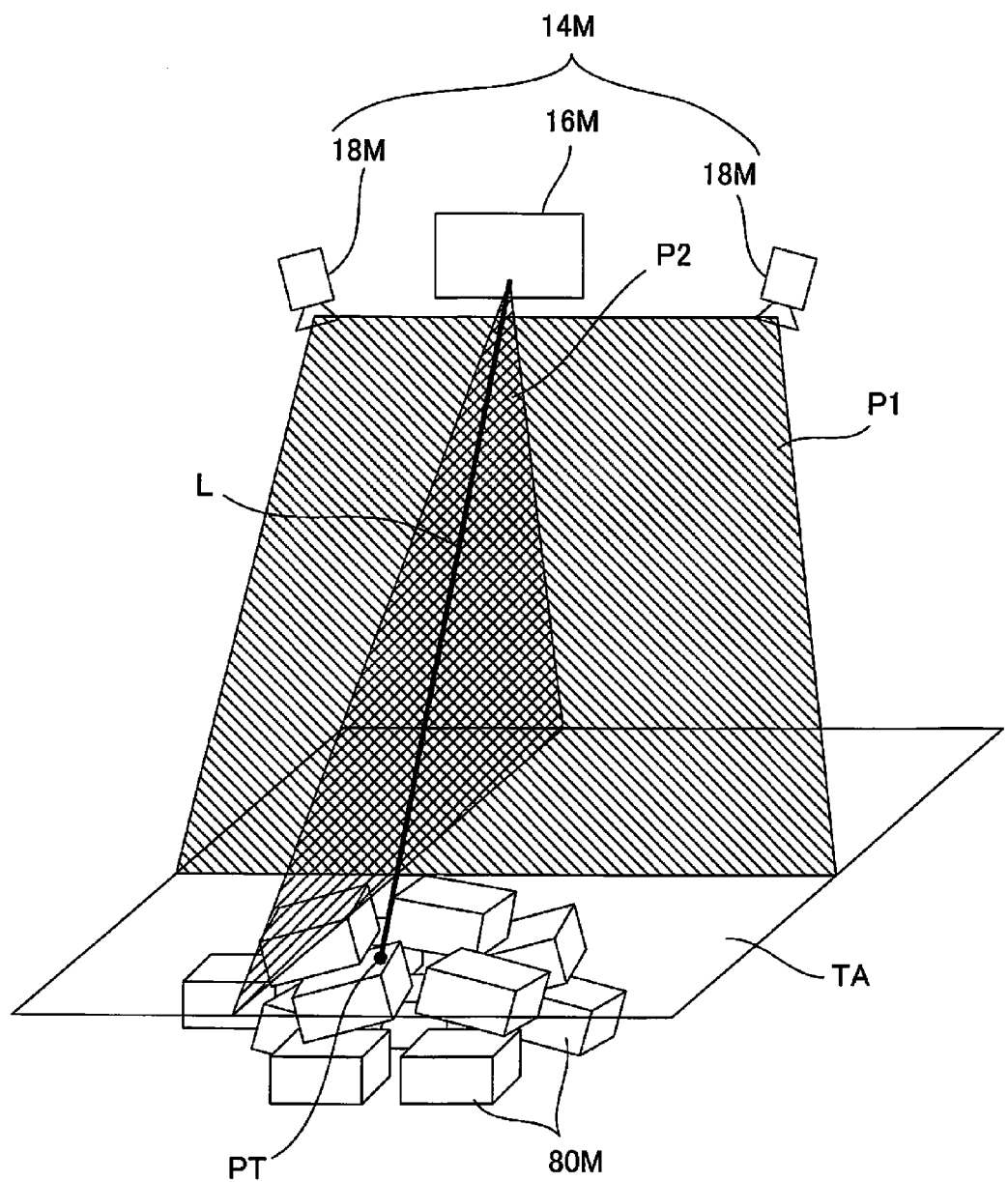
FIG. 9 is a view which shows an intersecting point of an intersecting line of a first plane and a second plane and a surface of a workpiece model.

Next, at step S8, the three-dimensional information calculation part 32 calculates the three-dimensional coordinates of the intersecting points PT between the plurality of intersecting lines L which are obtained at step S7 and the surface of the workpiece model 80M. FIG. 9 shows as an example one intersecting line L and the intersecting point PT where that intersecting line L intersects the surface of a workpiece model 80M.

At step S9, the three-dimensional information calculation part 32 outputs the three-dimensional coordinates of the intersecting points PT which are calculated at step S8 as three-dimensional information of the workpiece models 80M. The three-dimensional information is, for example, stored in the RAM of the robot simulation system 10.

Then, at step S10, the position and posture calculation part 34 identifies a target workpiece model to be taken out by the robot model 60M and calculates the position and posture of the target workpiece model, based on the three-dimensional information of the workpiece models 80M which are obtained at step S9.

Finally, at step S11, the simulation run part 36 runs a simulation of the takeout process by moving the robot model 60M to a position where it can grip the target workpiece model.

Figure 10A:
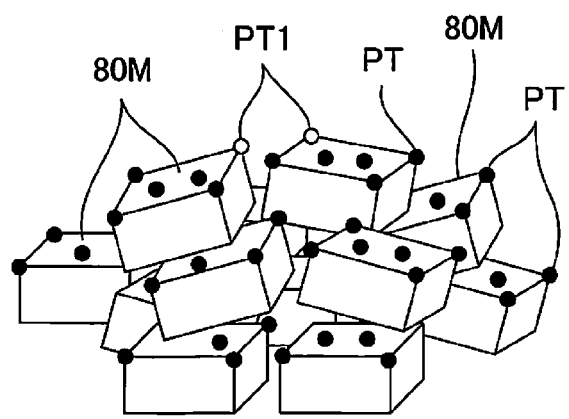
FIG. 10A is a view which explains an example of calculation of positions and postures of workpiece models based on intersecting points on surfaces of the workpiece models.
Figure 10B:
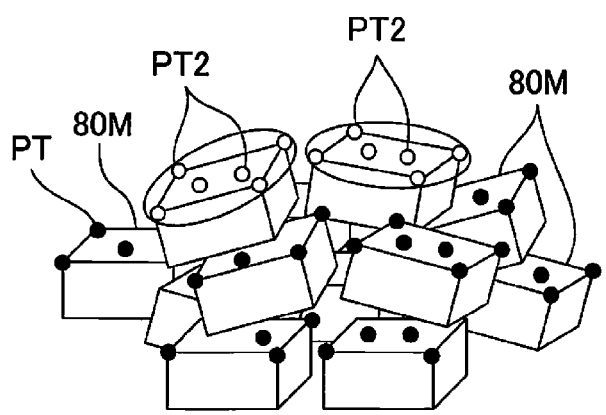
FIG. 10B is a view which explains an example of calculation of positions and postures of workpiece models based on intersecting points on surfaces of the workpiece models.
Figure 10C:
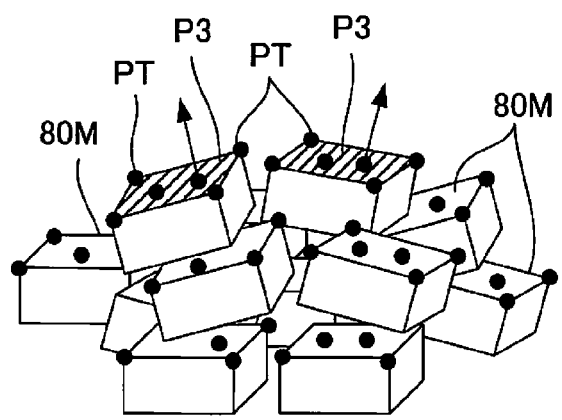
FIG. 10C is a view which explains an example of calculation of positions and postures of workpiece models based on intersecting points on surfaces of the workpiece models.

Next, referring to FIG. 10A to FIG. 10C, the method of calculating the positions and postures of workpiece models 80M from the three-dimensional coordinates of intersecting points PT on the surfaces of the workpiece models 80M will be explained. In FIG. 10A to FIG. 10C, the black dots show intersecting points PT between the intersecting lines L of the first planes P1 and the second planes P2 and the surfaces of the workpiece models 80M (see also FIG. 9).

In FIG. 10A, among the intersecting points PT of the workpiece models 80M, the intersecting points PT1 of the workpiece models 80M which are at the highest positions are shown by white circles. Generally, a takeout process of workpieces is performed so as to successively take out workpieces from ones which are positioned at the top. Therefore, the position and posture calculation part 34 identifies the positions of the vertices of the workpiece models 80M to be taken out based on the three-dimensional coordinates of the intersecting points PT1. In this case, the robot model 60M is positioned for gripping the workpiece models 80M, based on the positions of the vertices of the workpiece model 80M to be taken out. Alternatively, the robot model 60M may be controlled so as to grip the target workpiece model at a position away from the vertices, or the intersecting points PT1, over a certain distance, by additionally taking into account the known shape of the workpiece models 80M or the like.

In FIG. 10B, a group of points comprised of a plurality of intersecting points PT2 which are included within predetermined ranges are shown by white circles. In this case, the position and posture calculation part 34 calculates the positions and postures of the target workpiece models to be taken out based on the three-dimensional coordinates of these intersecting points PT2. Alternatively, the positions and postures of the target workpiece models to be taken out may be calculated based on the three-dimensional coordinates of the intersecting points PT2 and the known shapes of the workpiece models 80M.

In FIG. 10C, the planes P3 of the workpiece models 80M facing generally upward are shown by hatching. Normal lines with respect to the planes P3 are shown by arrow marks. The planes P3 and the normal lines with respect to the planes P3 are obtained by connecting the group of points included within certain ranges as exemplified in FIG. 10B. In this case, the position and posture calculation part 34 calculates the positions and postures of the workpiece models 80M based on the positions and postures of the particular planes of the workpiece models 80M.

According to the robot simulation system according to the present embodiment, the group of first planes and the group of second planes which are set in the virtual space are utilized to define a plurality of points on the surfaces of the workpiece models. Further, the three dimensional information of the plurality of points is acquired by the range sensor model in order to acquire the positions and postures of the workpiece models. Due to this, it becomes possible to simulate the takeout process of workpieces utilizing a range sensor by identifying a workpiece to be taken out positioned at the top with a vertex of the highest value, and by positioning the robot model for gripping according to the position of the vertex of the workpiece to be taken out, and further by controlling the gripping position away from the vertex based on the three dimensional information on the positions, postures and the shape of the workpiece. Such simulations enable easy evaluation of a control program or necessary changes thereof.

Figure 11:
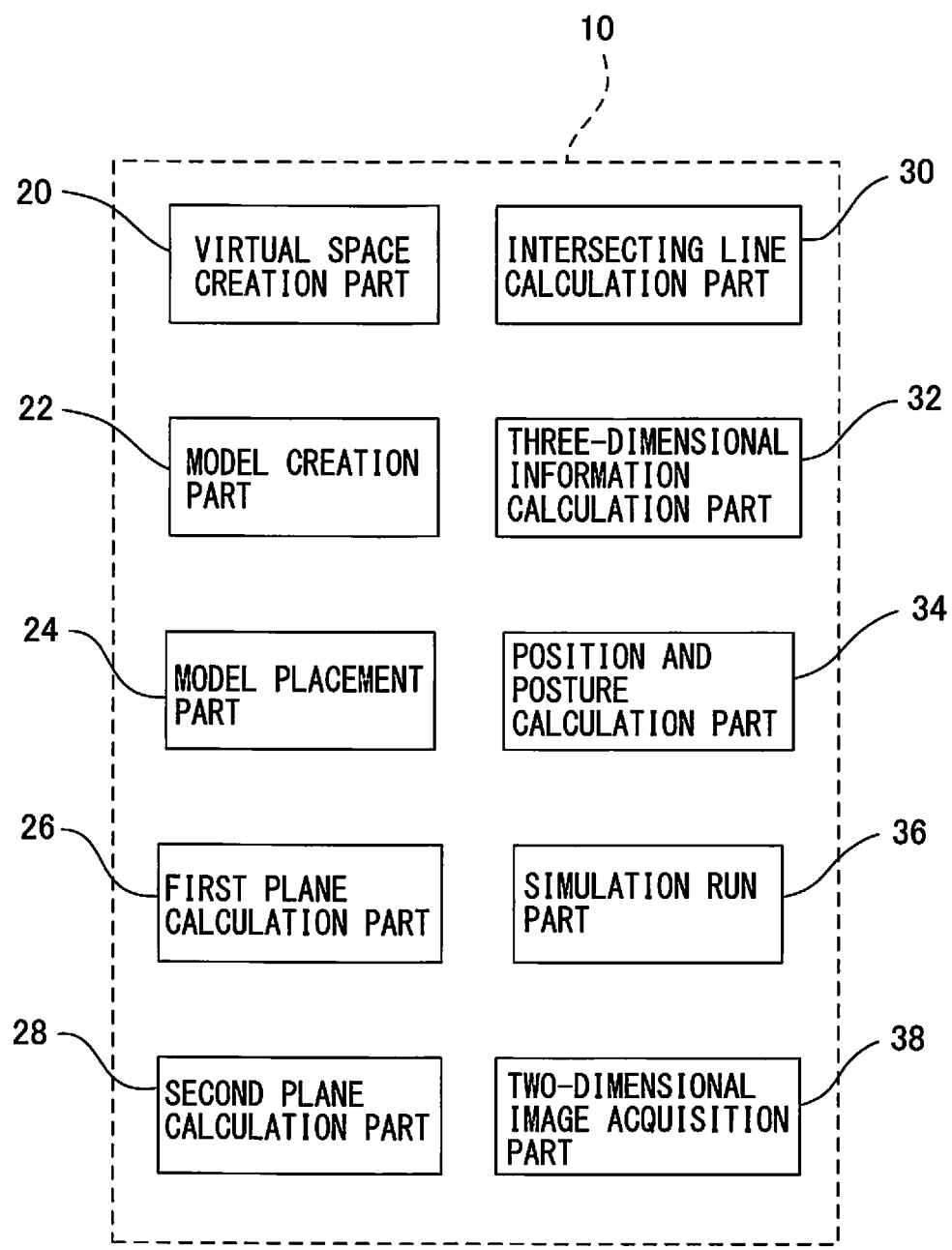
FIG. 11 is a functional block diagram of a robot simulation system according to another embodiment.

FIG. 11 is a functional block diagram of a robot simulation system 10 according to another embodiment. According to the present embodiment, the robot simulation system 10 includes, in addition to the configuration of the above-mentioned embodiment, a two-dimensional image acquisition part 38.

Figure 12:
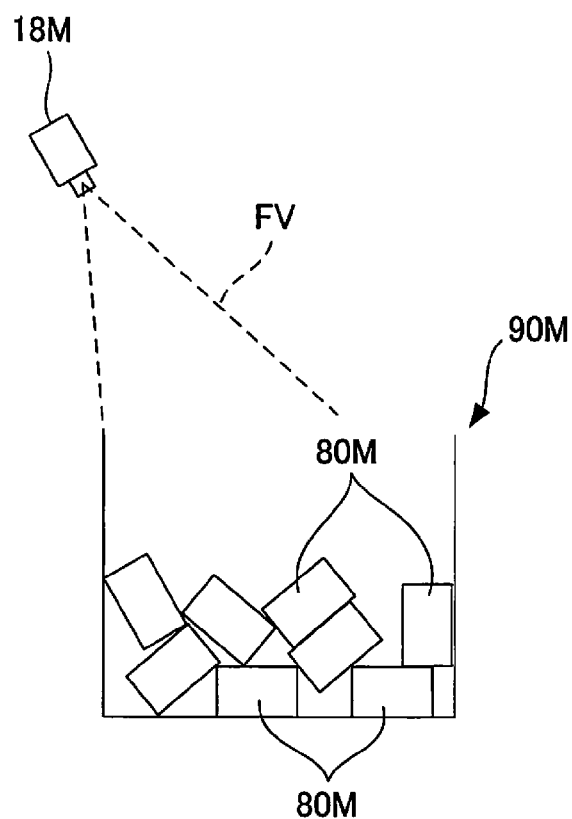
FIG. 12 is a view which shows a field of vision of a camera model.

The two-dimensional image acquisition part 38 has the function of acquiring a two-dimensional image of the bulk stacked workpiece models 80M by a camera model 18M. FIG. 12 is a view which shows a field of vision FV of a camera model 18M which operates with the two-dimensional image acquisition part 38. The two-dimensional image acquisition part 38 is configured to use one of the two camera models 18M of the range sensor model 14M in order to acquire a two-dimensional image. Alternatively, a separate camera model can be used for this purpose.

Figure 13:
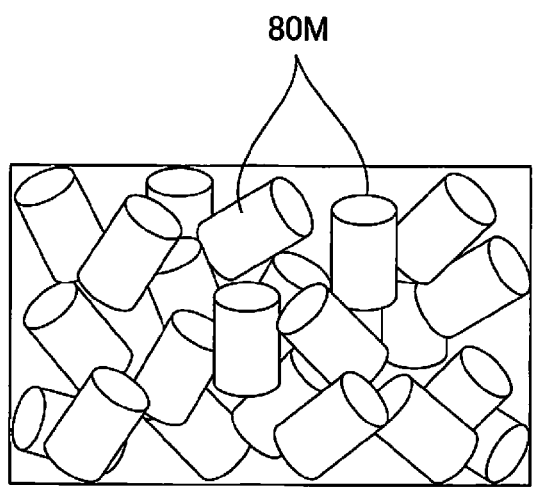
FIG. 13 is an example of a two-dimensional image which is captured by the camera model of FIG. 12.

FIG. 13 shows an example of the two-dimensional image which is captured by the camera model 18M. In the illustrated example, the image of bulk stacked cylindrical workpiece models 80M is captured. The acquired two-dimensional image is processed by an image processing device to calculate the positions and postures of the workpiece models 80M.

Figure 14:
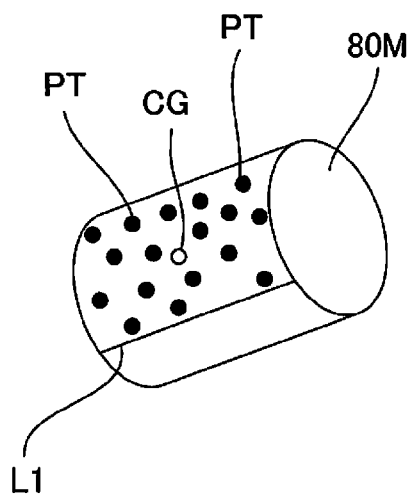
FIG. 14 is a view for explaining an exemplary use of a two-dimensional image.
Figure 15:
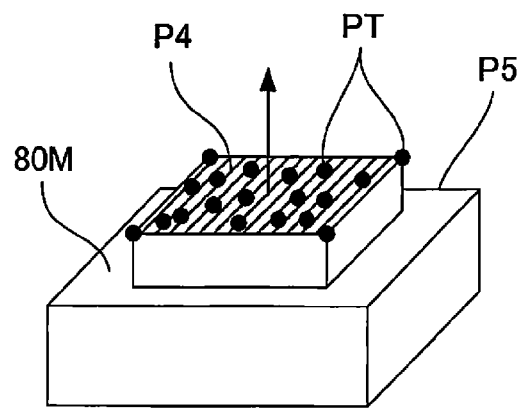
FIG. 15 is a view for explaining an exemplary use of a two-dimensional image.
Figure 16:
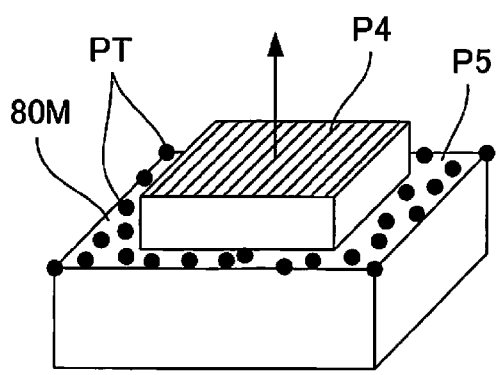
FIG. 16 is a view for explaining an exemplary use of a two-dimensional image.

FIG. 14 to FIG. 16 are views for explaining exemplary use of the two-dimensional image which is acquired by the two-dimensional image acquisition part 38. In FIG. 14, the line L1 which is drawn on the workpiece model 80M is the boundary line of the detection range by the two-dimensional image acquisition part 38. That is, a part of the workpiece model 80M below the line L1 of FIG. 14 cannot be seen behind another workpiece model 80M, for example. In this case, the position and posture calculation part 34 of the robot simulation system 10 processes the acquired two-dimensional image to identify the part of the workpiece model 80M and utilizes the three-dimensional information of the identified part of the workpiece model 80M (three-dimensional coordinates of intersecting points PT). For example, the position and posture calculation part 34 calculates the position of the center of gravity CG of the workpiece model 80M of that part based on the three-dimensional information of a workpiece model 80M which is contained in the range of detection of the two-dimensional image. In this case, the robot model 60M is positioned for gripping the workpiece model 80M based on the position of the center of gravity CG of the workpiece model 80M.

FIG. 15 shows a workpiece model 80M which has a composite shape comprised of two rectangular parallelepiped elements having different dimensions stacked on one another. In this case, for example, the two-dimensional image which is acquired by the two-dimensional image acquisition part 38 is processed to identify the plane P4 of the workpiece model 80M. Further, the three-dimensional information (three-dimensional coordinates of intersecting points PT) on the specified plane P4 is utilized. For example, the position and posture calculation part 34 calculates the position and posture of the plane P4 or the direction of extension of the normal line with respect to the plane P4, based on the three-dimensional information of the workpiece model 80M which is contained in the plane P4 in the two-dimensional image. In this case, the robot model 60M is positioned for gripping the workpiece model 80M based on the position and posture of the plane P4 or the direction of extension of the normal line with respect to the plane P4.

Alternatively, as shown in FIG. 16, the position and posture of the plane P4 or the normal direction with respect to the plane P4 may be calculated based on the three-dimensional information (three-dimensional coordinates of intersecting points PT) on the plane P5, which is different from the plane P4 of the workpiece model 80M which is identified from the two-dimensional image.

According to the present embodiment, since a two-dimensional image of workpiece models which is acquired by a camera model is further utilized, the positions and postures of the workpiece models can be more accurately calculated. The more accurate positions and postures of the workpiece models can be used as the basis to run a simulation of the takeout process of the workpieces, so the reliability of the simulation can be improved.

Effect of the Invention

According to the robot simulation system which employs the above-described configuration, the group of first planes and the group of second planes which are set in the virtual space are utilized to identify a plurality of points on the surfaces of the workpiece models. Further, three-dimensional information of the plurality of points is acquired by a range sensor model to acquire the positions and postures of the workpiece models. Due to this, it becomes possible to simulate the takeout process of workpieces utilizing a range sensor and easily evaluate a control program or make the necessary changes.

Although the various embodiments and modifications of the present invention have been described above, it is apparent to a person skilled in the art that functions and effects intended by the present invention can be obtained through other embodiments and modifications. In particular, constituent elements of the embodiments and the modifications described above can be removed or replaced, or a known element can further be added thereto, without departing from the scope of the present invention. In addition, it is apparent to a person skilled in the art that the present invention can be implemented by any combination of the features of the embodiments disclosed implicitly or explicitly in the present specification.

What is claimed is:

1. A robot simulation system for simulating in a virtual space a takeout process for successively taking out a plurality of bulk stacked workpieces by a robot, based on three-dimensional information of the workpieces which is obtained by a range sensor including two cameras and a projector, the robot simulation system comprising a model placement part which places in the virtual space a robot model, a plurality of workpiece models, two camera models, and a projector model which three-dimensionally express the robot, the plurality of workpieces, and the two cameras and the projector of the range sensor, respectively, wherein the model placement part is configured to place the plurality of workpiece models in the virtual space in a bulk stacked state, and place the two camera models and the projector model in the virtual space so that fields of vision of the two camera models and a projection range of the projector model encompass a measurement region which is set for bulk stacked workpiece models, the robot simulation system further comprising:

a first plane calculation part which calculates a group of first planes which extend through focal points of the two camera models and divide the fields of vision of the two camera models at equal intervals when capturing the measurement region;

a second plane calculation part which calculates a group of second planes which intersect the group of first planes and extend through the projector model and boundaries of light-dark contrast which are formed on the measurement region when the projector model projects stripe shaped patterns of light on the measurement region;

an intersecting line calculation part which calculates a plurality of intersecting lines between the group of first planes and the group of second planes;

a three-dimensional information calculation part which calculates positions of a plurality of intersecting points between the plurality of intersecting lines and surfaces of the workpiece models as three-dimensional information of the workpiece models, a position and posture calculation part which calculates positions and postures of the workpiece models based on the three-dimensional information of the workpiece models, and a simulation run part which runs a simulation of the takeout process by the robot model based on the positions and postures of the workpiece models which are calculated by the position and posture calculation part.

2. The robot simulation system according to claim 1, wherein the model placement part is configured to place a second camera which captures an image of the bulk stacked workpiece models in the virtual space, the robot simulation system further comprises a two-dimensional image acquisition part which acquires a two-dimensional image of the bulk stacked workpiece models from the second camera, and the position and posture calculation part is further configured to calculate positions and postures of the workpiece models, based on the three-dimensional information of the workpiece models and the two-dimensional image.

* * * * *